United States Patent [19]

Scharf

[11] Patent Number: 5,066,361

[45] Date of Patent: Nov. 19, 1991

[54] METHOD AND PRODUCT FOR IMPROVED GLASS FIBER REINFORCED AND FILLED THERMOPLASTIC AND THERMOSETTING RESIN SYSTEMS

[76] Inventor: Jonathan Scharf, 364-A7 St. Andrews Rd., Glenmoore, Pa. 19343

[21] Appl. No.: 524,402

[22] Filed: May 15, 1990

[51] Int. Cl.$^5$ .................. B44C 1/22; C03C 15/00; C03C 25/06

[52] U.S. Cl. ............................. 156/663; 65/31; 156/629; 428/268; 428/361; 428/429

[58] Field of Search ............... 156/629, 630, 633, 657, 156/663; 65/2, 30.1, 31; 427/309; 428/228, 229, 266, 273, 268, 361, 429

[56] References Cited

U.S. PATENT DOCUMENTS

| | | | |
|---|---|---|---|
| 2,261,148 | 11/1941 | Ebaugh | 427/309 |
| 2,700,010 | 1/1955 | Balz | 156/663 X |
| 3,445,254 | 5/1969 | Tiede | 156/663 X |
| 3,578,426 | 5/1971 | Philipps et al. | 156/663 X |
| 3,637,550 | 1/1972 | Sprauer | 156/332 X |
| 4,274,907 | 6/1981 | Vig et al. | 156/637 |
| 4,292,236 | 9/1981 | Ibsen et al. | 260/42.52 |
| 4,415,404 | 11/1983 | Riegl | 156/635 |
| 4,710,217 | 12/1987 | Bailey et al. | 65/31 |

OTHER PUBLICATIONS

S. Sterman and J. G. Marsden, *Theory of Mechanisms of Silane Coupling Agents in Glass Reinforced and Filled Thermoplastic and Thermosetting Resin Systems*, Union Carbide Corporation, 270 Park Ave., New York, New York 10017.

*Primary Examiner*—William A. Powell
*Attorney, Agent, or Firm*—Michael F. Petock

[57] ABSTRACT

A method and product for improved glass fiber reinforced and filled thermoplastic and thermosetting resin systems utilizes glass fiber material which is first etched and then silanated using an organo-functional silane. The etching of the glass fiber may be performed utilizing hydrofluoric acid, acidulated phosphate fluoride or the equivalent thereof.

19 Claims, No Drawings

METHOD AND PRODUCT FOR IMPROVED GLASS FIBER REINFORCED AND FILLED THERMOPLASTIC AND THERMOSETTING RESIN SYSTEMS

BACKGROUND OF THE INVENTION

The present invention relates to an improved method and product for glass fiber reinforced and filled thermoplastic and thermosetting resin systems.

Glass fiber reinforced resin systems are widely used today for everything from boat hulls, to automobile bodies, to toys, sliding boards and the like. Glass fiber material reinforced resin systems are widely used and often referred to as "FIBERGLAS" which is a trademark of Owens-Corning Corp. The present invention provides an improved method of manufacturing and repairing such items.

The manufacture and repair of glass fiber reinforced resin systems is well known. Balz in U.S. Pat. No. 2,770,010 discloses an acid treatment of glass fabric, prior to lamination, wherein the glass fabric is treated with formic acid to improve the water resistance of the ultimate laminate. Balz teaches subsequent use of a chrome complex or a silane application. However, Balz does not disclose the use of hydrofluoric acid or acidulated phosphate fluoride which produces a roughened surface as observed under the microscope and as taught by the present invention.

SUMMARY OF THE INVENTION

Briefly, in accordance with the present invention, a method and product are disclosed for providing improved glass fiber reinforced and filled thermoplastic and thermosetting resin systems wherein the glass fiber material is first etched with hydrofluoric acid, acidulated phosphate fluoride or other suitable etchant to produce a roughened surface on the glass fiber material which promotes adhesion. Such roughened surface of the glass fiber of the glass fiber material has been observed under a microscope. The etched glass fiber material, which may take various forms, is then silanated with a silane coupling agent and utilized in a conventional manner in the production of a glass fiber reinforced resin system.

DETAILED DESCRIPTION OF THE PREFERRED EMBODIMENTS

The present invention relates to a method and product for improved glass fiber reinforced and filled thermoplastic and thermosetting resin systems wherein the glass fiber material is first etched to produce a roughened surface on the glass fiber material. This has been observed under the microscope. In the presently preferred embodiments of the invention, the glass fiber material is etched with either hydrofluoric acid or 1.23% acidulated phosphate fluoride (or other suitable percentage). However, it is understood that other etchants may be utilized which function in the same way to produce the same result.

The glass fiber material may be glass fiber woven cloth, uniform mesh, random mesh, rope, thread or other material made of glass fibers. The resins may be any of the various thermoplastic or thermosetting resins.

The etched glass fiber material is then silanated with an organo-functional silane. Some examples of organo-functional silanes are vinyltrichlorosilane, vinyltriethoxysilane, vinyltris(beta-methoxyethoxy)silane, gamma-methacryloxypropyltrimethoxysilane, beta-(3,4 - epoxycyclohexyl)-ethyltrimethoxysilane, gamma-glycidoxypropyltrimethoxysilane, gamma-aminopropyltriethoxysilane, and N-beta-(aminoethyl)-gamma-aminopropyltrimethoxysilane.

The organo-function silanes act as coupling agents between the glass fiber material and the composite resin. A chemical bridge between the coupling agents and the glass substrates requires both a reactive silane and a reactive site on the glass surface. The number and arrangement of the reactive sites on the glass surface is increased by the etching process described herein. In the fiber glass reinforcement, the reactive sites are the silanols on the glass surface. The silane coupling agents react with these surface silanols through hydrolyzable groups bonded to the silicon atom of the coupling agent molecule. These reactive groups can be —OH, —CL, —OR, —OAc or —NR$_2$. Further discussion of the theory of the mechanisms of silane coupling agents in glass reinforced and filled thermoplastic and thermosetting resin systems is available in the publication S. Sterman and J.G. Marsden, Theory of Mechanisms of Silane Coupling Agents in Glass Reinforced and Filled Thermoplastic and Thermosetting Resin Systems, Union Carbide Corporation, 270 Park Avenue, New York, N.Y. 10017 and the contents of that publication is incorporated herein by reference.

In accordance with the present invention, a method is provided of improved fiber glass reinforced and filled resin systems which may utilize thermoplastic or thermosetting resins. The fiber glass material, whether it is woven cloth, uniform mesh, random mesh, rope, thread or the like, is first etched to roughen its surface, which roughening may be observed under a microscope and may be described as microporosities. The etching may be performed using either hydrofluoric acid, 1.23% acidulated phosphate fluoride or other suitable etchant. Any suitable silane coupling agent and particularly the organo-functional silanes may be utilized, and these include vinyltrichlorosilane, vinyltriethoxysilane, vinyltris(beta-methoxyethoxy)silane, gamma-methacryloxypropyltrimethoxysilane, beta-(3,4 - epoxycyclohexyl)-ethyltrimethoxysilane, gamma-glycidoxypropyltrimethoxysilane, gamma-aminopropyltriethoxysilane, and N-beta-(aminoethyl)-gamma-aminopropyltrimethoxysilane.

In a preferred embodiment, it is contemplated that the product of the glass fiber material may be provided in preetched form. That is, glass fiber woven material, random or uniform mesh, rope or thread may be first treated with the hydrofluoric acid and sold in that form for use in the production of an etched silanated glass fiber reinforced product.

In view of the above, the present invention may be embodied in other specific forms without departing from the spirit or essential attributes thereof and, accordingly, reference should be made to the appended claims, rather than to the foregoing specification as indicating the scope of the invention.

I claim:

1. A method of providing improved glass fiber reinforced and filled resin systems, comprising the steps of:
   etching the glass fiber material;
   silanating the etched glass fiber material; and
   applying a resin to the etched silanated glass fiber material.

2. A method in accordance with claim 1 wherein the etching step is performed by using hydrofluoric acid.

3. A method in accordance with claim 1 wherein the etching step is performed by using acidulated phosphate fluoride.

4. A method in accordance with claim 1 wherein said silanating step is performed by using an organo-functional silane selected from the group consisting of vinyltrichlorosilane, vinyltriethoxysilane, vinyl-tris(betamethoxyethoxy) silane, gamma-methacryloxypropyltrimethoxysilane, beta-(3,4-epoxycyclohexyl)-ethyltrimethoxysilane, gamma-glycidoxypropyltrimethoxysilane, gamma-aminopropyltriethoxysilane, and N-beta-(aminoethyl)-gamma-aminopropyltrimethoxysilane.

5. A method in accordance with claim 1 wherein said glass fiber material is selected to be in the form of woven glass fiber cloth.

6. A method in accordance with claim 1 wherein said glass fiber material is selected to be in the form of a uniform mesh.

7. A method in accordance with claim 1 wherein said glass fiber material is selected to be in the form of a random mesh.

8. A method in accordance with claim 1 wherein said glass fiber material is selected to be in the form of a rope or thread.

9. A method in accordance with claim 1 wherein said resin is selected to be a thermoplastic resin.

10. A method in accordance with claim 1 wherein said resin is selected to be a thermosetting resin.

11. A product for producing an improved glass fiber reinforced or filled resin system, comprising:

an etched glass fiber material, said glass fiber material being etched with a compound selected from the group consisting of hydrofluoric acid and acidulated phosphate fluoride to create microporosities in the surface of said glass fiber material which is adapted to create micro mechanical retention between the glass fiber and the resin to increase the strength of the bonding between the glass fibers and the resinous material applied to the glass fibers.

12. A product in accordance with claim 11 wherein said etched glass fiber material is silanated with an organofunctional silane.

13. A product in accordance with claim 12 wherein said organo-functional silane is selected from the group consisting of vinyltrichlorosilane, vinyltriethoxysilane, vinyl-(tris(betamethoxyethoxy)silane, gamma-methacryloxypropyltrimethoxysilane, beta-(3,4-epoxycyclohexyl)-ethyltrimethoxysilane, gamma-glycidoxypropyltrimethoxysilane, gamma-aminopropyltriethoxysilane, and N-beta-(aminoethyl)-gamma-aminopropyltrimethoxysilane.

14. A product in accordance with claim 11 wherein said glass fiber material is selected to be in the form of woven glass fiber cloth.

15. A product in accordance with claim 11 wherein said glass fiber material is selected to be in the form of a uniform mesh.

16. A product in accordance with claim 11 wherein said glass fiber material is selected to be in the form of a random mesh.

17. A product in accordance with claim 11 wherein said glass fiber material is selected to be in the form of a rope or thread.

18. A product in accordance with claim 11 wherein a glass fiber reinforced or filled resin system is constructed utilizing a thermoplastic resin.

19. A product in accordance with claim 11 wherein a glass fiber reinforced or filled resin system is constructed utilizing a thermosetting resin.

* * * * *